Aug. 25, 1970 TOSHIAKI HAYASHIDA ET AL 3,525,146

METHOD OF MAKING SEMICONDUCTOR DEVICES HAVING CRYSTAL EXTENSIONS FOR LEADS

Filed Dec. 7, 1966

INVENTORS
TOSHIAKI HAYASHIDA
SHOJI SUGAYA
BY Darby & Darby
ATTORNEY

United States Patent Office 3,525,146

Patented Aug. 25, 1970

3,525,146

METHOD OF MAKING SEMICONDUCTOR DEVICES HAVING CRYSTAL EXTENSIONS FOR LEADS

Toshiaki Hayashida, Hirakata, Osaka, and Shoji Sugaya, Nishinomiya, Japan, assignors to Sanyo Electric Co., Ltd., Osaka, Japan, a corporation of Japan Filed Dec. 7, 1966, Ser. No. 599,762
Claims priority, application Japan, Dec. 11, 1965, 40/76,736
Int. Cl. H01j *17/00*
U.S. Cl. 29—589 20 Claims

ABSTRACT OF THE DISCLOSURE

Methods of making semiconductor devices in which the layers of semiconductor material have extensions of crystal material which can be used for contact leads.

The present invention relates to new and improved semiconductor devices including transistors, especially to semiconductor devices in which a plurality of layers having different type conductivities are provided with their own semiconductor crystal extensions having the same type conductivities as those of said layers respectively. The invention also relates to improvements in the manufacture of semiconductor devices of the type mentioned in the above.

Usually, electrical connection of a minute semiconductor device such as a transistor or integrated circuit element to an electrode structure having leading conductors is made through fine gold wires. However, the welding of fine wires at the predetermined positions can only be accomplished with difficulty because use of a microscope is requested to find out connecting positions in addition to the fact that the welding operation must be carried out by hand one by one for a number of connecting positions.

The primary object of the invention is to provide improved semiconductor devices in which a plurality of layers having different type conductivities are provided with their own semiconductor crystal extensions having the same type conductivities as those of the layers, respectively, so that those extensions may be used as terminals.

Another object of the invention is to provide an improved method for the manufacture of semiconductor devices of the kind mentioned in the above, through the utilization of the vapor-liquid-solid mechanism of crystal growth.

A further object of the invention is to provide a new and improved method for producing at a time a plurality of semiconductor crystal extensions having different type conductivities on different layers having the same type conductivities as those of the crystal extensions.

A still another object of the invention is to provide an improved method for electrically connecting a plurality of layers having different type conductivities in a semiconductor device to the respective leading conductors.

A still further object of the invention is to provide an improved semiconductor device assembly in which a plurality of layers in a semiconductor device are electrically connected to the corresponding electrodes on an insulating support without any connecting wires and the electrical connection can be carried out at a time and by a single operation for a plurality of connecting positions.

Various other possible objects and advantages of the present invention will become apparent to those skilled in the art from the following description of the present invention. Although the invention is herein illustrated with respect to particular preferred embodiments thereof, no limitation is intended thereby, and reference is made to the appended claims for a precise delineation of the true scope of the present invention.

The invention is illustrated in the accompanying drawings wherein.

Figure 1:
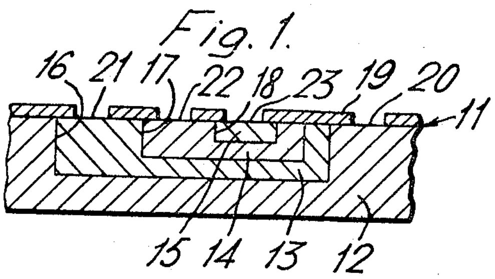
FIGS. 1, 2, 3 and 4 are sectional views through a semiconductor device at separate stages of manufacture thereof in accordance with the present invention.

Considering now the improved method of the present invention as same relates to the manufacture of an integrated circuit element including a transistor, reference is made to FIGS. 1 to 4 of the drawing. As the first step in the mnaufacture there is prepared a solid semiconductor substrate including therein a plurality of layers having different type conductivities and at least one P–N junction therebetween. In the embodiment illustrated in FIG. 1, the substrate generally indicated as 11 consists of four layers 12, 13, 14 and 15 and three P–N junctions 16, 17 and 18. For example, the layers 12 and 14 are of P-type and the layers 13 and 15 are of N-type. The layers 13, 14 and 15 may constitute a transistor where the layer 13 is a collector, the layer 14 a base and the layer 15 an emitter. The layers 12, 13 14 and 15 have coplanar surfaces which are covered by a protective coating 19 except a small exposed area for each of the layers for electrical connection. The exposed areas are indicated with the numerals 20, 21, 22 and 23, respectively.

The most typical and preferred material for the substrate 11 is Si, but other material such as Ge, GaAs and SiC having similar characteristics may also be used as the material for the substrate 11. Hereafter, the invention will be particularly described with reference to the Si substrate, which is a preferred embodiment.

In order to manufacture such the substrate structure including four layers having different type conductivities as shown in FIG. 1, a base material of P-type is first prepared. The P-type base material is formed substantially of Si but includes an acceptor impurity such as B, Ga, Al or In. The P-type layer 12 is formed of this base material as it is. The N-type layer 13, the P-type layer 14 and the N-type layer 15 may be subsequently produced by the triple diffusion techniques which is known in the art from the base material of P-type. Among the impurities to be used for diffusion there are B and P for the P-type and N-type, respectively. The shape and the size of the substrate may be decided at will. A preferred shape is a thin wafer as usual in the manufacture of transistors.

The coating 19 is preferably formed of a silicon oxide and various methods of producing such a layer are known in the art as, for example, by exposure of the Si wafer to moisture and air, or by the utilization of an oxidizing agent such as hydrogen peroxide or the like. The semiconductor device of this type is known as a planar transistor and may be manufactured acccording to any of known processes. A preferred process is described in detail in U.S. patent specification No. 3,025,589, granted to J. A. Hoerni.

Figure 2:
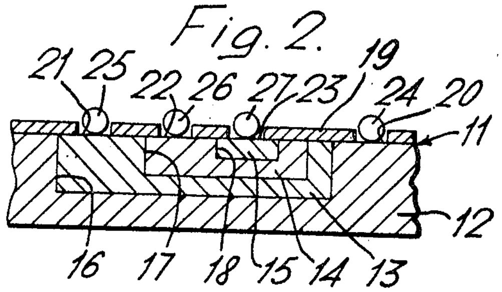

In order to provide each of the layers 12, 13, 14 and 15 with an electrode or terminal which is in turn in ohmic contact with a conductor, a semiconductor crystal extension is formed on the surface of each of the layers through the utilization of the vapor-liquid-solid mechanism of crystal growth. For this purpose, as the second step of the invention, a melt solution in which the crystal material to be grown is soluble is formed on an exposed surface each of the layers. This can be achieved by placing a suitable solution forming agent on an exposed area of the surface each of the layers and then heating to melt it. In FIG. 2, the reference numerals 24, 25, 26 and 27 indicate small metal pieces which are placed as the solution forming agents on the exposed areas 20, 21, 22 and 23 of the coplanar surfaces of the layers 12, 13, 14 and 15, respectively. Each of the exposed areas 20, 21, 22 and 23 may be very small but should be just enough to allow the crystal growth there with a desired diameter. In this connection, it should be noted that all the junctions 16, 17 and 18 must be protected by the coating 19 from exposure. The removal of the protective coating 19 at the limited areas to be exposed may be accomplished by photoresist and etching techniques which are known in the art.

Each of the small metal pieces 24, 25, 26 and 27 must be a suitable solution forming agent which is capable to form a liquid solution with the crystalline material to be grown at the deposition temperature. The distribution coefficient of the agent, $k=C_s/C_l$, must be less than 1, where $C_s$ and $C_l$ are the solubilities of the agent in the solid and liquid, respectively, at the deposition temperature. The agent must have a low vapor pressure and a very small solubility in solid silicon. Among preferred solution forming agents there may be mentioned Au, Pt, Ni, Ag, Cu, In and alloys of the foregoing. In the growth of compounds crystals, such as GaAs or SiC the agent can be one of the components, gallium or silicon.

A preferred shape of these small metal pieces is a globule having a diameter within the range of 10 microns to 150 microns, most preferably, a diameter within the range of 30 microns to 80 microns, but any other shapes, for example a cylindrical shape and a thin plate or film form, may also be utilized. Such a thin film as mentioned above may be formed through the utilization of vapor plating techniques.

The subsequent step of the process of the invention is to heat the small metal particle or pieces 24, 25, 26 and 27 on the areas 20, 21, 22 and 23, preferably in an inert atmosphere, to melt it to form a liquid alloy with Si of the substrate 12. In order to carry out this step, a suitable reaction apparatus may be used. The reaction apparatus may comprise a reaction chamber in which a silicon substrate with metal pieces thereon as the solution forming agents is placed, means for heating the metal pieces on the substrate within the reaction chamber and means for supplying inert gas such as hydrogen into the reaction chamber.

Figure 3:
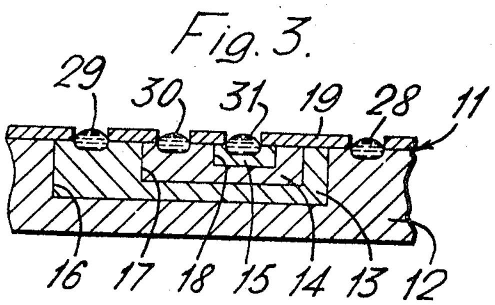

Each of the elements as the solution forming agents forms a liquid solution with Si at a temperature below the melting temperature of Si. The temperature for forming a liquid solution would be within the range of 700° C. to 1000° C. In the case of gold as the agent, which is one of the most preferred agents, the temperature for melting is selected within the range of 800° C. to 1000° C., preferably, at about 850° C. The temperature at which the melting operation is carried out should be maintained at constant (±5° C., preferably ±2.5° C.) until the melting is completed. The melts of the small metal pieces are alloyed with Si of the substrate material within the respective layers 12, 13, 14 and 15 to form liquid alloys 28, 29, 30 and 31 as shown in FIG. 3. Since the liquids are in contact with the exposed surface of Si, their composition is the equilibruim one. It is well known that Si dissolves anisotropically during the alloying process.

It would be adivsable that a good wettability of gold to the surface of the Si substrate will be obtained by subjecting the surface of the Si substrate to the treatment with a mixture of nitric acid and hydrofluoric acid to remove dust and oxide impurities on the surface.

As described hereinafter, the crystal growth is produced at limited areas covered by the liquid alloys on the solid substrate. Without any coating as indicated with the reference numeral 19 in FIGS. 1 to 4, it is probable that in some cases a liquid alloy on the surface of one layer encroaches on the surface of another layer. There is, therefore, a request for controlling the wetting area of the liquid layer.

We have found that the wetting area of the liquid alloy on the substrate can be controlled by utilizing as the solution forming agent an alloy of a metal such as Au, Ag, Pt, Ni, Cu or In with the same material as the substrate, typically Si. In the case for the Au-Si alloy, the Si content in atomic percentage should be within the range of 7 to 55, preferably about 30. With such an alloy like this as the solution forming agent, the area which is wetted by the agent is remarkably decreased. This is because how far the wetting area spread depends on the metal content of the agent. An example for the embodiment of the invention with use of Au-Si alloy as the solution forming agent is given as follows:

A globule of a Au-Si-P alloy having a diameter of 100 microns was placed on a semiconductor layer having a N-type conductivity. The Au-Si-P alloy was of Au 59.5, Si 40 and P 0.5 in atomic percentage. The layer was formed substantially of Si but included some impurities producing therein a conductivity of N-type. When a temperature of 900° C. was applied in a $H_2$ gas atmosphere to melt the globule, the wetting area of the Au-Si alloy 24 was about 0.025 mm.$^2$. For comparison purpose, another experiment was made with a high pure (99.99%) gold globule as the solution forming agent. The other conditions were the same as in the above. The wetting area produced by the Au-Si alloy was 0.2 mm.$^2$ or larger. It will be appreciated from the foregoing that with the use of the Au-Si alloy as the solution forming agent the wetting area of the liquid phase to the solid phase is remarkably decreased.

We have made further investigations and studies on the wetting of the liquid alloy to the solid substrate. It is known that the liquid alloy extends in the form of a substantially triangular shape. After many and exhaustive experiments, we have found that the wetting area of the liquid phase to the solid substrate can be controlled in a substantially hexagonal form by carrying out the alloying process in the presence of the vapor including $H_2$ and a halide of the substrate material. An example for the embodiment of the invention with use of $SiCl_4$ gas during the alloying process is given as follows:

A globule of Au-Si alloy (Au 60 and Si 40 in atomic percentage) having a diameter of 100 microns was placed on a semiconductor substrate having a P-type conductivity. The substrate was formed substantially of Si but included some impurities producing therein a conductivity of P-type. The Au-Si alloy globule on the Si substrate was heated at 900° C. for 4 minutes in a $H_2$ gas atmosphere. The heating was continued at the same temperature for another 5 minutes while introducing $SiCl_4$ at a $SiCl_4$ to $H_2$ mole ratio of $10^{-4}$. It was observed that the wetting area of the Au-Si alloy was substantially hexagonal of which the maximum diameter was 140 microns. For comparison purpose, another experiment was made with the same alloy globule but without introducing $SiCl_4$. The other conditions were the same as in the above. The wetting area produced by Au-Si alloy was of a substantially triangular shape of which the height was about 210 microns.

The control of the wetting area of the liquid alloy in the two manners as described above is significant in the case of the substrate without a protective coating as well because it is desired that the exposed areas 20, 211, 22 and 23 are entirely covered by respective liquid alloys 28, 29, 30 and 31 with exact quantities.

The third step of the process of the invention is to apply to the liquid-solid system of the liquid alloys 24, 25, 26 and 27 on the solid substrate 11 produced by the preceding step, a vapor phase producing therefrom deposition of crystal material to be grown. This may be achieved by introducing a compound which is capable to let free the same element as the substrate material by pyrolysis or reduction. Among such the compounds there are hydrides and halides. In the case for Si as the substrate material, free Si can be obtained by the pyrolysis of $SiH_4$ as well as by the reduction of silicon halides such as $SiCl_4$, $SiHCl_3$, $SiBr_4$ and $SiI_2$. In a preferred embodiment of the invention the vapor phase comprises a halide of the crystal material to be grown, which is usually, the same element or material as the substrate material and a reducing agent. In the case of Si as the substrate material the halide to be included in the vapor phase is one of silicon halides including $SiCl_4$, $SiHCl_3$ and $SiBr_4$. A typical reducing agent to be also included in the vapor phase is hydrogen. If the liquid-solid system produced in the preceding step is in a hydrogen atmosphere, the vapor phase described is formed by the introduction of a halide of the substrate material with a suitable carrier gas into the system. If any other inert gas is used in the preceding step, the inert gas atmosphere should be replaced by the vapor phase described. In the latter case, a mixture of a silicon halide and hydrogen will be introduced to the system.

The vapor-liquid-solid process according to the invention will be described for the case of gold as the solution forming agent and silicon as the substrate. The $SiCl_4$ vapor may be introduced together with $H_2$ as a carrier into the system and then reduced by hydrogen by the aid of the temperature of the system. The liquid Au-Si alloys 28, 29, 30 and 31 shown in FIG. 3 is preferential sinks for Si atoms deriving from the $SiCl_4$ vapor by the hydrogen reduction. The liquid alloys become supersaturated with Si to a value critical for grown of Si at the solid-liquid interface. The excess Si from each of the liquids is deposited on (111) planes which form the solid-liquid interface. During the early stages the substrate material, which dissolves during the alloying process as mentioned before, will be regrown. Subsequently, the liquid droplets rise from the original substrate surface atop the growing whisker crystals. The growth direction of the whiskers is normal to the (111) surface. In this manner the vapor-liquid mechanism produces at a time unidirectional crystal growths perpendicular to the respective solid-liquid interfaces at different layers.

The deposition should be carried out at constant temperature (±5° C., preferably ±2.5° C.). For the case of gold as the solution forming agent the deposition should be carried out at a temperature within the range of 850° C. to 1050° C., preferably at about 950° C. It is advisable to carry out the crystal growth at a temperature higher than that of the preceding alloying process in order to completely remelt the regrown Si layer from the liquid alloy, which may be produced at the boundaries of the alloys with the substrate, when once cooled after the alloying process.

It should be noted that during the deposition process the system is kept in a hydrogen atmosphere enough to reduce the introduced $SiCl_4$ vapor. Accordingly, there would be the case in which new hydrogen gas is necessitated to be supplied into the system. The amount of $SiCl_4$ to be supplied should be controlled within a limited range. If an excess of $SiCl_4$ is introduced to the system, numerous discrete polyhydral crystals will be grown not only at the area of the liquid Au-Si alloy but also at other undesirable areas since deposition of Si may be directly on a solid substrate in a vapor-solid system. On the other hand, if $SiCl_4$ is insufficiently supplied to the system, the crystal growth will be very slow. A preferred $SiCl_4$ to $H_2$ mole ratio is within the range of 0.005 to 0.04, most preferably, about 0.02 where the total hydrogen flow supplied to the system is 1000 cm.$^3$ per min.

In order to perfectly prevent any crystal growth at any other undesirable areas than the local areas covered by the respective liquid alloys, it will be recommendable to form a non-conducting coating on the surface of the substrate except the local areas at which the crystal growth is desired as mentioned before. Though the coating layer which is a preferred embodiment is a $SiO_2$ film formed by oxidizing the surface of the silicon substrate but any other coatings such as silicon nitrides may be used as well.

Essentially, the same process as described in the above takes place when the agent is one of other elements listed before. The details, such as temperature of deposition, vary because the phase relations of the several elements with silicon are different. However, generally speaking, the temperature would be able to be selected at 1000° C. or lower through all the cases with use of those agents.

According to the invention, the crystal growth of Si is obtained in the form of a "whisker." The silicon whisker are known dislocation free. The diameter of grown silicon whiskers depends on the areas covered by the liquid solutions or alloys. The length of grown silicon whiskers can be decided at will by controlling the growing reaction time. Practically, in the case the products manufactured according to the invention are used for transistor devices, the diameter and the length of the grown silicon whiskers would be within the range of 10 microns to 300 microns and within the range of 10 microns to 500 microns, respectively.

Figure 4:
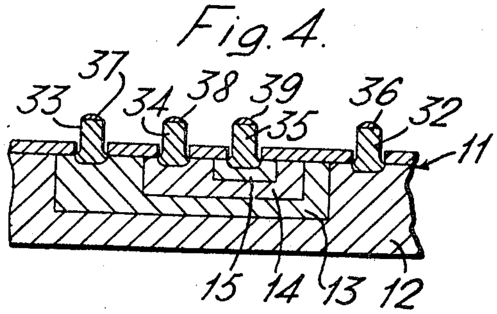

After desired lengths of silicon whiskers are grown, the system is cooled within the reaction chamber to prevent the grown crystals from oxidation. The product thus obtained comprises a semiconductor substrate 11 including four layers having different type conductivities, namely, two P-type layers 12 and 14, and two N-type layers 13 and 15, semiconductor crystal extensions 32, 33, 34 and 35 from the respective layers 12, 13, 14 and 15, and metal tips 36, 37, 38 and 39 atop the respective crystal extensions, as shown in FIG. 4. The crystal extensions 32, 33, 34 and 35 have the same type conductivities as those of the respective layers 12, 13, 14 and 15 since they are supplied with certain amounts of impurities from the respective layers during the crystal growth in the vapor-liquid-solid mechanism. If an ample amount of an impurity or impurities is included in the exposed area each of the layers, no additional means would be necessary to ensure these crystal extensions to have the required type conductivities, respectively. In many cases, however, it is advisable to add an appropriate amount of an impurity or impurities of the type required to each of the metal pieces 24, 25, 26 and 27 so that the crystals 32, 33, 34 and 35 may be furnished with the required type impurity from the respective metal pieces 24, 25, 26 and 27. Among the acceptor impurities producing a P-type conductivity there are Ga, In, B, Al and a mixture of the foregoing and among the donor impurities producing an N-type conductivity there are Sb, As, P and a mixture of the foregoing. The amount of the impurity to be added varies in a wide range depending on the required properties but practically within the range of 0.01% to 30% in weight percentage.

The metal tips 36, 37, 38 and 39 at the tops of the crystal extensions 32, 33, 34 and 35 are produced by cooling the liquid alloys 28, 29, 30 and 31 to be solidified and are in ohmic contact with the respective semiconductor crystal extensions 32, 33, 34 and 35. In the typical embodiment described before, these metal tips are formed substantially of an Au-Si alloy. Since the crystal extensions 32, 33, 34 and 35 have the same type conductivities as those of the respective substrate layers 12, 13, 14 and 15, these crystal extensions with metal tips 35, 37, 38 and 39 can be used conveniently as terminals or electrodes for electrically connecting the layers of different type conductivities to the respective leading conductors extending in different directions.

An example for the manufacture of an integrated circuit element including a transistor in which four layers having different type conductivities are provided with the respective crystal extensions is given for further explanation with specific dimensions and properties as follows:

Referring to FIG. 1 again, a substrate 11 in the form of a Si wafer was prepared. The substrate 11 consisted of four layers 12, 13, 14 and 15 which had P-type, N-type, P-type and N-type, respectively. These four layers having different type conductivities were produced by the triple diffusion techniques which is known in the art. The three layers 13, 14 and 15 constituted a transistor where the layer 13 was a collector, the layer 14 a base and the layer 15 an emitter. The upper surfaces of these four layers were coplanar and entirely covered by a protective coating of an $SiO_2$ film 19 except a small exposed area 20, 21, 22 or 23 on the surface each of the layers. The $SiO_2$ film 19 had a thickness of 4000–6000 A. Each of the exposed areas 20, 21, 22 and 23 had a diameter of 150 microns. Metal globules 24, 25, 26 and 27 as solution forming agents were placed on the exposed areas 20, 21, 11 and 23, respectively, as shown in FIG. 2. Each of the metal globules had a diameter of 90 microns. The metal globules 24 and 26 placed on the P-type layers 12 and 14 were made of an alloy of Au 74%, Si 6% and In 20% in weight while the metal globules 25 and 27 placed on the N-type layers 13 and 15 were made of an alloy of Au 74%, Si 6% and Sb 20%.

The metal globules 24, 25, 26 and 27 placed on the Si substrate were heated at a temperature of 960° C. ± 10° C. in a $H_2$ gas atmosphere within a reaction chamber. After the globules were molten to form liquid alloys with Si of the substrate and these liquid alloys (28, 29, 30 and 31 in FIG. 3) were saturated with Si, a mixture of $SiCl_4$ and $H_2$ was introduced at a $SiCl_4$ to $H_2$ mole ratio of 0.01 to 0.02 into the reaction chamber. After maintaining the temperature at 960° C. for 15 minutes, four crystal extensions 32, 33, 34 and 35 were grown as shown in FIG. 4. The crystal extensions 32 and 34 have a P-type conductivity while the crystal extensions 33 and 35 have a N-type conductivity. Each of the crystal extensions has a diameter of 120 microns, a length of 80 microns and an electrical resistance of 2 ohms. The electrical properties of the transistor consisting of the three layers 13, 14 and 15 with the respective crystal extensions were as follows:

Emitter grounded current gain—20–40
Collector resistance—40–50 ohm
Current gain-band width frequency—20–50 mc.

The substrate 11 may include a plurality of such the transistor structure as shown in FIG. 4. In such the case like this the P-type layer 12 is used for isolation of a transistor structure from any other transistor structures. The crystal extension 32 grown on the layer 12 is used for supplying a reverse biased voltage of 5 to 6 volts to the P-N junction 16 through the layer 12 for ensuring the isolation.

Figure 5:
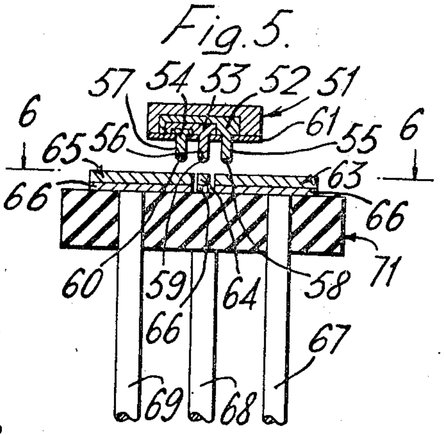
FIG. 5 is a vertical sectional view of a semiconductor device and an electrode structure on which said semiconductor device is to be installed.
Figure 6:
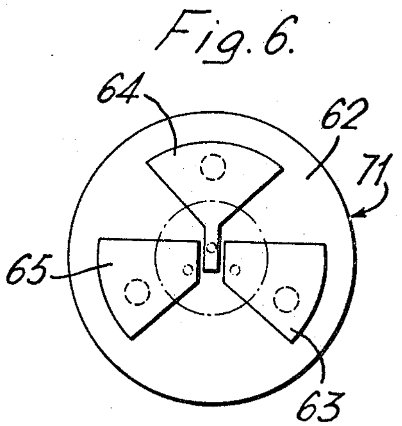
FIG. 6 is a plan view taken along the lines of 6—6 of FIG. 5.

The invention also provides an improved method for installing such the semiconductor devices as described in the above on an electrode structure. FIGS. 5 and 6 illustrate a preferred embodiment of installation of a semi-conductor device having three crystal extensions from different layers on an electrode structure including three exposed electrodes corresponding to the crystal extensions of said semiconductor device.

Referring to FIG. 5 the reference numeral 51 generally indicates a transistor pellet including a collector 52, a base 53 and an emitter 54 with crystal extensions 55, 56 and 57, respectively, produced according to the process mentioned before. The crystal extensions 55, 56 and 57 have metal tips 58, 59 and 60 at the respective tops thereof. The collector 52, the base 53 and the emitter 54 have coplanar surfaces which are entirely covered by a protective coating 61 such as a $SiO_2$ film except the local areas from which the crystal extenions extend.

The electrode structure generally indicated with the reference numeral 71 comprises an insulating support or stem 62, three exposed electrodes 63, 64 and 65 arranged in a spaced relation on one surface of the insulating support 62. The insulating support is made of an insulating material such as glass or ceramics, preferably transparent one. Each of the electrodes 63, 64 and 65 is made of a conductive material such as Au or Al in the form of a segment. At the central portion of the insulating support 62 these three electrodes are very close to but spaced from each other.

In order to adhere the exposed electrodes 63, 64 and 65 to the surface of the insulating support, it is advisable to use between the surface of the support 62 and each of the exposed electrodes an intermediate metal layer 66 showing a good adhesion both to the insulating material and to the electrode material there are Cr and N-Cr alloy. The intermediate layers 66 may be formed by the vacuum evaporation plating technique.

Preferably the exposed surface each of the electrodes 62, 64 and 65 is subjected to a plating treatment with a solder. The electrodes 63, 64 and 65 have leading conductors 67, 68 and 69 electrically connected thereto, respectively. The conductors 67, 68 and 68 may extend through the insulating support 62 as shown in FIG. 5.

The adhesion of the crystal extensions 55, 56 and 57 to the corresponding electrodes 63, 64 and 65 is carried out by pressing the transistor pellet 51 having three crystal extensions on the lower surface thereof to the electrode structure 61 which is maintained at a fixed position, while heating the electrode structure at a temperature at which the solder is molten, in such a manner that the metal tips 58, 59 and 60 atop the respective crystal extensions 55, 56 and 57 may become in contact with the corresponding electrodes at their portions located near the center of the insulating support 72. If the insulating support 62 made of a transparent material, the registry of the crystal extensions with the corresponding electrodes can be performed with less difficulty because the operation can be seen through the transparent insulating support 62.

It will be understood from the foregoing that installation of a transistor pellet on an electrode structure can be carried out easily and without any difficulties with which we shall encounter in the case where each of the layers of a transistor be electrically connected to a corresponding electrode through a fine conductor wire.

In the above semiconductor assembly, the use of a solder on the exposed surface each of the electrodes 63, 64 and 65 is not necessarily required. For example, in the case where the metal tips 58, 59 and 69 are formed substantially of Au and the exposed electrodes 63, 64 and 65 are also formed of Au, they can be directly adhered to each other through the utilization of the ultra sonic bonding technique. Deposition of the exposed electrodes 63, 64 and 65 on the surface of the insulating support 62 may be carried out by electroless plating. The electrodes may also be formed by printing some conductive resins directly on an insulating surface.

What we claim is:

1. A method for the manufacture of a semiconductor device in which a plurality of layers having different type conductivities are provided with their own semiconductor crystal extensions having the same type conductivities as those of said layers, respectively, which comprises the steps of preparing a solid semiconductor substrate including therein a plurality of layers having different type conductivities and at least one P-N junction therebetween, forming on an exposed surface of each of said layers a melt solution in which the crystal material to be grown is soluble, said melt solution occupying only a desired portion of said exposed surfaces, applying to the liquid-solid system of said melt solution on said solid substrate a vapor phase and producing therefrom by deposition said crystal extensions of the respective crystal materials to be grown.

2. A method for the manufacture of a semiconductor device as defined in claim 1, in which said layers having different type conductivities have coplanar surfaces.

3. A method for the manufacture of a semiconductor device as defined in claim 2, in which said coplanar surfaces are covered by a protecting coating except a small exposed area for each of said layers.

4. A method for the manufacture of a semiconductor device as defined in claim 1, in which said substrate material is a member selected from the group consisting of Si, Ge, GaAs and SiC.

5. A method for the manufacture of a semiconductor device as defined in claim 1, in which said substrate material is made of Si.

6. A method for the manufacture of a semiconductor device as defined in claim 1, in which said melt solution is formed by heating a small metal piece, as a solution forming agent, placed on said exposed surface, said metal piece being capable of forming a liquid solution with the crystal material to be grown.

7. A method for the manufacture of a semiconductor device as defined in claim 6, in which the crystal material to be grown is Si and said small metal piece as the solution forming agent is of a member selected from the group consisting of Au, Pt, Ni, Ag, Cu and In.

8. A method for the manufacture of a semiconductor device as defined in claim 6, in which the formation of said melt solution is carried out at an inert gas atmosphere.

9. A method for the manufacture of a semiconductor device as defined in claim 8, in which said inert gas is hydrogen.

10. A method for the manufacture of a semiconductor device as defined in claim 6, in which said small metal piece as a solution forming agent is of an alloy of a metal with the same material as the substrate.

11. A method for the manufacture of a semiconductor device as defined in claim 10, in which said substrate material is Si and said small metal piece as a solution forming agent is of an alloy with Si of a member selected from the group consisting of Au, Pt, Ni, Ag, Cu and In.

12. A method for the manufacture of a semiconductor device as defined in claim 6, in which the formation of said melt solution is carried out in the presence of the vapor including $H_2$ and a halide of the substrate material.

13. A method for the manufacture of a semiconductor device as defined in claim 12, in which the substrate material is Si and said vapor includes $H_2$ and $SiCl_4$.

14. A method for the manufacture of a semiconductor device as defined in claim 1, in which said vapor phase comprises a halide of the material to be grown and a reducing agent.

15. A method for the manufacture of a semiconductor device as defined in claim 14, in which said material to be grown is the same material as the substrate material.

16. A method for the manufacture of a semiconductor device as defined in claim 15, in which said semiconductor substrate is made of Si and said halide gas is of a member selected from the group consisting of $SiCl_4$, $SiHCl_3$ and $SiBr_4$.

17. A method for the manufacture of a semiconductor device as defined in claim 14, in which said reducing agent is hydrogen.

18. A method for the manufacture of a semiconductor device as defined in claim 6, in which said metal piece includes an impurity producing the same type conductivity as that of the layer to have said metal piece placed thereon.

19. A method for the manufacture of a semiconductor device as defined in claim 18, in which said impurity is an acceptor impurity selected from the group consisting of Ga, In, B, Al and a mixture of the foregoing.

20. A method for the manufacture of a semiconductor device as defined in claim 18, in which said impurity is a donor impurity selected from the group consisting of Sb, As, P and a mixture of the foregoing.

References Cited

UNITED STATES PATENTS 3,151,004 9/1964 Glicksman et al.

FOREIGN PATENTS 759,012 10/1950 Great Britain.

JOHN F. CAMPBELL, Primary Examiner

U.S. Cl. X.R.

29—591